United States Patent [19]
Imai et al.

[11] Patent Number: 6,054,251
[45] Date of Patent: Apr. 25, 2000

[54] PHOTOPOLYMERIZABLE COMPOSITION

[75] Inventors: Genji Imai, Hiratsuka; Hideo Kogure, Atsugi, both of Japan

[73] Assignee: Kansai Paint Co., Ltd., Hyogo-Ken, Japan

[21] Appl. No.: 08/936,840

[22] Filed: Sep. 25, 1997

[30] Foreign Application Priority Data

Sep. 25, 1996 [JP] Japan .................................. 8-272872

[51] Int. Cl.⁷ ........................... G03F 7/031; G03F 7/038; G03F 7/30
[52] U.S. Cl. .................................. 430/285.1; 430/281.1; 430/287.1; 430/286.1; 430/919; 430/195; 430/325; 522/10; 522/14; 522/28; 522/902; 522/26
[58] Field of Search ............................ 430/281.1, 287.1, 430/286.1, 919, 195, 285.1, 947, 917, 920, 922, 926, 325; 522/10, 14, 28, 902, 26

[56] References Cited

U.S. PATENT DOCUMENTS

| | | | |
|---|---|---|---|
| 3,418,295 | 12/1968 | Schoenthaler | 430/285.1 |
| 4,055,430 | 10/1977 | Hasegawa et al. | 96/90 R |
| 4,071,424 | 1/1978 | Dart et al. | 204/159.15 |
| 4,500,629 | 2/1985 | Irving et al. | 430/286.1 |
| 4,563,438 | 1/1986 | Berner et al. | 430/281.1 |
| 4,782,100 | 11/1988 | Iwamoto et al. | 522/120 |
| 4,849,321 | 7/1989 | Hung et al. | 430/284.1 |
| 4,970,135 | 11/1990 | Kushi et al. | 430/280.1 |
| 5,068,371 | 11/1991 | Steiner et al. | 556/53 |
| 5,322,762 | 6/1994 | Kushi et al. | 430/288.1 |
| 5,514,521 | 5/1996 | Kobayashi et al. | 430/281.1 |
| 5,639,802 | 6/1997 | Neckers et al. | 522/25 |
| 5,721,288 | 2/1998 | Aotani et al. | 522/12 |
| 5,882,843 | 3/1999 | Kudo et al. | 430/285.1 |

FOREIGN PATENT DOCUMENTS

WO 97/28194   8/1997   WIPO .

OTHER PUBLICATIONS

Registry No. 7478–69–5, Registry File of Americon Chemical Society obtained from STN Database Service, 1998.

*Primary Examiner*—Cynthia Hamilton
*Attorney, Agent, or Firm*—Wenderoth, Lind & Ponack, L.L.P.

[57] ABSTRACT

The present invention provides a visible laser-curable resist composition which contains at least one radical-protecting compound selected from a phosphorous acid ester compound and an aromatic compound having N,N-dimethylamino group bonded to the carbon atom forming the aromatic ring and which is free from the hindrance of curing caused by deactivation of radical by oxygen and has excellent curability, and a process for formation of a resist pattern using the above composition.

12 Claims, No Drawings

PHOTOPOLYMERIZABLE COMPOSITION

BACKGROUND OF THE INVENTION

1. Field of the Invention

The present invention relates to a photopolymerizable composition which is improved in hindrance of curing caused by deactivation of radical by oxygen and which has excellent curability, and also to a process for formation of a resist pattern from the composition by exposing the composition to a visible laser.

2. Description of the Prior Art

To form a conductor circuit of, for example, printed wiring board, it has been conducted to coat a photosensitive resist on a substrate, subjecting the resulting resist film to light exposure and development to form a resist pattern, and subjecting the resist pattern to etching to remove the unnecessary portion of the substrate.

The above light exposure is conducted by, for example, light exposure via a photomask or direct drawing using a laser. The light exposure via a photomask has problems, for example, in that a considerable time is needed for the positioning of the photomask and that the positioning of the photomask is difficult when the resist has surface tackiness.

The direct drawing using a laser requires a highly sensitive resist because the time of laser application is very short. Therefore, so that the active radical generated in the resist by laser application is not deactivated by the oxygen in air and the resist can maintain the high sensitivity, it is generally conducted to cover the surface of the resist with an oxygen-shielding layer (e.g. a cover coating layer or a cover film layer).

The present inventors made a study with a view to developing a resist usable in the direct drawing using a visible laser, in which resist the active radical generated by laser application is hardly deactivated by the oxygen in air and consequently the sensitivity of the resist can be maintained. As a result, it was found out that the above object can be achieved by allowing a resist to contain a particular radical-protecting compound. The present invention has been completed based on the finding.

SUMMARY OF THE INVENTION

According to the present invention, there is provided a photopolymerizable composition containing at least one radical-protecting compound selected from a phosphorous acid ester compound and an aromatic compound having N,N-dimethylamino group bonded to the carbon atom forming the aromatic ring.

According to the present invention, there is also provided a process for formation of a resist pattern, which comprises forming, on a substrate, a resist film made of the above photopolymerizable composition, then pattern-wise applying a visible laser to the resist film, and subjecting the visible laser-exposed resist film to development.

According to the present invention, there is also provided a process for formation of a resist pattern, which comprises forming, on a substrate, a resist film made of the above photopolymerizable composition, forming an oxygen-shielding layer on the resist film, then pattern-wise applying a visible laser to the resist film via the oxygen-shielding layer, and subjecting the visible laser-exposed resist film to development.

DETAILED DESCRIPTION OF THE INVENTION

The photopolymerizable composition of the present invention (hereinafter referred to as "resist composition" in some cases) can be any resist composition of negative type which is cured upon exposure to light (e.g. a visible laser), if the radical-protecting compound contained in the present photopolymerizable composition is excluded. The present composition may be a liquid resist or a dry film resist.

Representative examples of the present resist composition are those obtained by adding a particular radical-protecting compound to a system comprising a photocuring resin having photosensitive group crosslinkable or polymerizable upon light exposure, a polymerization initiator effective to a visible light and, as necessary, an ethylenically unsaturated compound.

The photosensitive group of the photocuring resin includes, for example, acryloyl group, methacryloyl group, cinnamoyl group, allyl group, azido group and cinnamylidene group. A preferable molecular weight of the photocuring resin is generally 1,000–100,000, preferably 3,000–50,000. A preferable amount of the photosensitive group of the photocuring resin is 0.2–5 moles/kg resin, particularly 3–5 moles/kg resin.

The photosensitive group of the photocuring resin is preferably acryloyl group or methacryloyl group. The photocuring resin having such photosensitive group can be obtained, for example, by adding a glycidyl group-containing polymerizable unsaturated compound (e.g. glycidyl methacrylate or glycidyl acrylate) to a carboxyl group-containing resin having a high acid value of preferably about 40–760, more preferably about 100–700, to introduce acryloyl group or methacryloyl group into the resin. The resin of high acid value includes, for example, an acrylic resin of high acid value and a polyester resin of high acid value. An acrylic resin of high acid value is particularly preferred.

The photopolymerization initiator effective to a visible light includes, for example, a combination of a hexaarylbisimidazole with a p-dialkylaminobenzylidene ketone or a dialkylaminochalcone [Japanese Patent Application Laid-Open No. 155292/1979 (corresponding to U.S. Pat. No. 4,162,162)], a combination of camphor quinone with a dye [Japanese Patent Application Laid-Open No. 84183/1973 (corresponding to U.S. Pat. No. 3,756,827)], a combination of a diphenyliodonium salt with a Michler's ketone (GB-A-2020297), a combination of a S-triazine type compound with a merocyanine dye (Japanese Patent Application Laid-Open No. 151024/1979), a combination of a S-triazine type compound with a thiapyrylium salt (Japanese Patent Application Laid-Open No. 40302/1983), a combination of 3-ketocoumarin with a titanocene compound [Japanese Patent Application Laid-Open No. 10602/1988 (corresponding to EP-A-242330)], a combination of a compound represented by the following general formula:

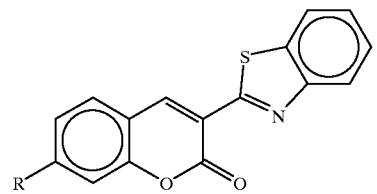

(wherein R is a lower dialkylamino group such as diethylamino group or the like, a lower dialkenylamino group or an alicyclic amino group) with a titanocene compound (Japanese Patent Application Laid-Open No. 239703/1991), a combination of a dialkylaminocoumarin type sensitizer represented by the following general formula:

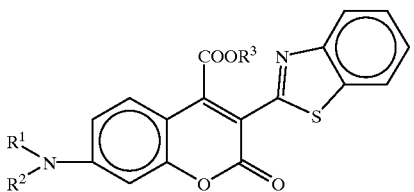

(wherein $R^1$ and $R^2$, which may be the same or different, are each a lower alkyl group; and $R^3$ is a hydrogen atom, a lower alkyl group, an alkoxyalkyl group, a hydroxy-alkoxyalkyl group or an alkoxycarbonylalkyl group) with an iron-allene complex or a titanocene compound [Japanese Patent Application Laid-Open No. 223759/1991 (corresponding to U.S. Pat. No. 5,045,434)], a combination of a compound represented by the following general formula:

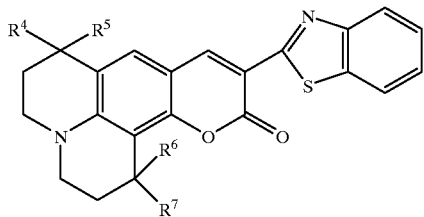

(wherein $R^4$, $R^5$, $R^6$ and $R^7$ are each independently an alkyl group of 1–3 carbon atoms such as methyl group or the like) or a compound represented by the following general formula:

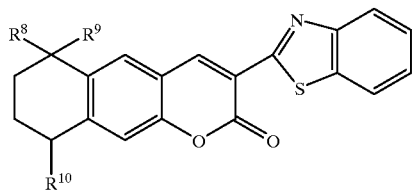

(wherein $R^8$, $R^9$ and $R^{10}$ are each independently an alkyl group of 1–3 carbon atoms such as methyl group or the like) with a titanocene compound, and a combination of one of the above combinations, with a nitrogen-containing compound such as benzotriazole or the like.

A suitable amount of the polymerization initiator used is generally 0.1–10 parts by weight, particularly 0.5–5 parts by weight per 100 parts by weight of the total of the photocuring resin and the ethylenically unsaturated compound described below.

The ethylenically unsaturated compound optionally used in the present resist composition is a compound having at least one, preferably 1–4 ethylenically unsaturated double bonds, and includes a monomer, a dimer, a trimer or other oligomer all capable of insolubilizing the exposed portion of resist by causing addition polymerization when exposed to a light. Specific examples of such a compound are acrylic acid, methacrylic acid, ethylene glycol di(meth)acrylate, diethylene glycol di(meth)acrylate, triethylene glycol di(meth)acrylate, tetra- to hexadecaethylene glycol di(meth)acrylate, propylene glycol di(meth)acrylate, trimethylolpropane tri(meth)acrylate, pentaerythrithol tetra(meth)acrylate, ethylene glycol diitaconate, ethylene glycol dimaleate, hydroquinone di(meth)acrylate, resorcinol di(meth)acrylate, pyrogallol (meth)acrylate, oligourethane acrylate, oligoepoxy acrylate and divinylbenzene. In the present specification, "(meth)acrylate" refers to acrylate or methacrylate.

The amount of the ethylenically unsaturated compound used can be generally 200 parts by weight or less, preferably 1–100 parts by weight, more preferably 3–50 parts by weight per 100 parts by weight of the photocuring resin. The ethylenically unsaturated compound can be used singly or in combination of two or more compounds.

The radical-protecting compound used in the present resist composition hinders the deactivation by oxygen, of the radical generated in the resist film (formed from the composition) when the film is exposed to a visible laser for curing, and thereby can allow the resist film to have good photosensitivity even in the presence of oxygen. In the present invention, there is used, as the radical-protecting compound, at least one compound selected from a phosphorous acid ester compound and an aromatic compound having N,N-dimethylamino group bonded to the carbon atom forming the aromatic ring.

A photopolymerizable composition generates a radical when exposed to a light; however, in the presence of oxygen, the radical reacts with oxygen to form a peroxyradical and these peroxyradical molecules ordinarily react with each other, resulting in the deactivation of the radical. Meanwhile, when the photopolymerizable composition contains a radical-protecting compound according to the present invention, it is presumed that most of the above-mentioned peroxyradical molecules react with the radical-protecting compound to form a different radical and this different radical contributes to the curing reaction of resist film; as a result, the photopolymerizable composition of the present invention can maintain high sensitivity even in the presence of oxygen.

Representative examples of the phosphorous acid ester compound can be dialkyl ($C_{1-20}$), diaryl or diaralkyl phosphites such as dimethyl phosphite, diethyl phosphite, dipropyl phosphite, dibutyl phosphite, bis(2-ethylhexyl) phosphite, diphenyl phosphite, dibenzyl phosphite and the like; trialkyl ($C_{1-20}$) or triaryl phosphites such as trimethyl phosphite, triethyl phosphite, triisopropyl phosphite, tributyl phosphite, trilauryl phosphite, triphenyl phosphite, triisodecyl phosphite, tris(tridecyl) phosphite and the like; aralkyl dialkyl ($C_{1-10}$) phosphites such as benzyl diethyl phosphite and the like; and tri(haloalkyl) phosphites such as tris(2,2,2-trifluoroethyl) phosphite, tris(2-chloroethyl) phosphite and the like.

Representative examples of the aromatic compound having N,N-dimethylamino group bonded to the carbon atom forming the aromatic ring can be N,N-dimethylaniline derivatives such as N,N-dimethylaniline, 4-bromo-N,N-dimethylaniline, 4-tert-butyl-N,N-dimethylaniline, 2,6-diisopropyl-N,N-dimethylaniline, 4,4'-vinylidenebis(N,N-dimethylaniline), 4,4'-methylenebis(N,N-dimethylaniline), 4,4'-methylenebis(2,6-diisopropyl-N,N-dimethylaniline), N,N,2,4,6-pentamethylaniline, N,N-dimethyl-m-toluidine, 4-(2-pyridylazo)-N,N-dimethylaniline, N,N-dimethyl-4-nitrosoaniline and the like.

Of the above aromatic compounds, those having a molecular weight of 120–400 are particularly preferred in view of their compatibility with the resist resin and the sensitivity of the resulting resist film to visible light.

The amount of the radical-protecting compound used is not particularly restricted and can be varied depending upon, for example, the kind and amount of the photopolymerization initiator used; however, an appropriate amount, when viewed from the photosensitivity of the resist film, the strength of the cured film, etc., is generally 0.1–30 parts by weight, preferably 0.5–20 parts by weight, more preferably 1–10 parts by weight per 100 parts by weight of the solid content of the resist composition.

The resist composition of the present invention can further comprise, as necessary, an adhesion promoter; a photopolymerization initiator and a sensitizer both effective to ultraviolet light; a polymerization inhibitor such as hydroquinone, 2,6-di-tert-butyl-p-cresol (BHT), N,N-diphenyl-p-phenylenediamine or the like; organic resin fine particles; a pigment such as coloring pigment, extender pigment or the like; a metal oxide such as cobalt oxide or the like; a plasticizer such as dibutyl phthalate, dioctyl phthalate, tricresyl phosphate, polyethylene glycol, polypropylene glycol or the like; an organic solvent; and so forth.

The adhesion promoter is used in order to increase the adhesivity of resist film to substrate. As the adhesion promoter, there can be mentioned, for example, tetrazoles such as tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole, 5-chloro-1-phenyl-1H-tetrazole and the like.

As the photopolymerization initiator effective to ultraviolet light, there can be mentioned, for example, acetophenones such as diethoxyacetophenone, 2-hydroxy-2-methyl-1-phenylpropane-1-one, benzyl dimethyl ketal, 1-(4-isopropylphenyl)-2-hydroxy-2-methylpropane-1-one, 4-(2-hydroxyethoxy)phenyl (2-hydroxy-2-propyl) ketone, 1-hydroxycyclohexyl phenyl ketone, 1-phenyl-1,2-propanedione-2-(o-ethoxycarbonyl)oxime, 2-methyl-2-morpholino-(4-thiomethylphenyl)propane-1-one, 2-benzyl-2-dimethylamino-1-(4-morpholinophenyl)butanone and the like; benzoin ethers such as benzoin, benzoin methyl ether, benzoin ethyl ether, benzoin isopropyl ether, benzoin isobutyl ether and the like; benzophenones such as benzophenone, methyl o-benzoylbenzoate, 4-phenylbenzophenone, 4,4'-dichlorobenzophenone, hydroxybenzophenone, 4-benzoyl-4'-methyldiphenyl sulfide, alkylbenzophenone, 3,3',4,4'-tetra(tert-butylperoxycarbonyl)-benzophenone, 4-benzoyl-N,N-dimethyl-N-[2-(1-oxo-2-propenyloxy)ethyl] benzenemethanaminium bromide, (4-benzoylbenzyl) trimethylammonium chloride, 2-hydroxy-3-(4-benzoylphenoxy)-N,N,N-trimethyl-1-propanaminium chloride monohydrate and the like; thioxanthones such as 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthene-2-yloxy)-N,N,N-trimethyl-1-propanaminium chloride and the like; 2,4,6-trimethylbenzoyldiphenylphosphine oxide; 2,2'-bis((o-chlorophenyl)-4,5,4',5'-tetraphenyl-1,2-biimidazole; 10-butyl-2-chloroacridone; 2-ethylanthraquinone; 1,2-diphenylethane; 9,10-phenanthrenequinone; camphorquinone; and methylphenylglyoxy ester. These compounds can be used singly or as a mixture of two or more compounds.

In some cases, the above photopolymerization initiator can be used in combination with a sensitizer, whereby higher sensitivity to ultraviolet light can be obtained. As such a sensitizer, there can be used known sensitizers such as triethanolamine, methyidiethanolamine, triisopropanolamine, methyl 4-dimethylaminobenzoate, ethyl 4-dimethylaminobenzoate, isoamyl 4-dimethylaminobenzoate, (2-dimethylamino)ethyl benzoate, (n-butoxy)ethyl 4-dimethylaminobenzoate, 2-ethylhexyl 4-dimethylaminobenzoate, Michler's ketone, 4,4'-diethylaminobenzophenone and the like.

The resist composition of the present invention can be produced, for example, by uniformly mixing the above-mentioned individual components in an appropriate solvent.

Next, description is made on the process for formation of a resist pattern from the present resist composition by forming, on a substrate, a visible laser-curable resist film from the composition and curing the resist film pattern-wise.

The substrate on or to which the present resist composition is coated or adhered, is not particularly restricted as long as the resist composition can be coated thereon or adhered thereto. Representative examples of the substrate are a glass plate; a substrate obtained by forming, on a glass plate, a thin film of a metal or metal oxide such as indium-tin oxide (ITO), chromium, copper or the like; a metal plate such as aluminum plate, copper plate or the like; a plastic plate such as polycarbonate plate, acrylic resin plate, glass-epoxy plate or the like; a laminate plate having a metal layer as the surface layer, such as copper-plated or copper-clad glass-epoxy plate or the like; and a laminate plate obtained by making throughholes in the above laminate plate.

Formation of a visible laser-curable resist film on the substrate using the present resist composition is conducted, for example, as follows. When the present resist composition is a liquid resist composition, the composition is coated on a substrate by spray coating, electrostatic coating, roll coating, curtain flow coating, spin coating, silk screen printing, dipping, electrodeposition or the like, and the resulting resist film is dried. When the resist composition is a dry film resist, the protective film is peeled and the resulting dry film resist is heat-bonded to a substrate to form a resist film. The dry film resist need not have a cover film layer but may have it as necessary. The thickness of the resist film is not particularly restricted and can be determined appropriately depending upon the application of the resist pattern obtained. A preferable thickness is 0.5–50 $\mu$m, particularly 1–40 $\mu$m, more particularly 3–30 $\mu$m in terms of dry film thickness.

Formation of a dry film resist from the present resist composition can be conducted, for example, by coating the present resist composition on a transparent film (e.g. a polyester film) (this film later becomes a cover film layer) by the use of a roll coater, a blade coater, a curtain coater or the like, drying the resulting resist film, and sticking a protective film onto the resist layer of the dried resist film.

In the present process for formation of a resist pattern, a visible laser-curable resist film is formed on a substrate in the above-mentioned manner; as necessary, an oxygen-shielding layer is formed on the resist film; then, the resist film is exposed to a visible laser pattern-wise; thereafter, development is conducted to form a resist pattern.

The oxygen-shielding layer is formed so that the radical generated in the resist film by light exposure is shielded from the oxygen in air and prevented from being deactivated by oxygen and thereby the curing of the resist by light exposure can proceed smoothly. The oxygen-shielding layer may be a cover coating layer formed on the resist film by coating, or a cover film layer formed by sticking a film on the resist film. When a dry film resist is used, only by adhering a dry film resist having a cover film layer, to a substrate, a cover film layer can be formed simply.

The oxygen-shielding layer is made of a material which is non-photosensitive, has substantially no tackiness at room temperature, has oxygen shieldability, and is transparent to a light applied. Therefore, the material preferably has a glass transition temperature (Tg) of 20° C. or above, preferably 30–80° C., more preferably 40–70° C.

The oxygen shieldability of the oxygen-shielding layer preferably is $5\times10^{-12}$ cc. cm/cm². sec. cmHg or less, particularly $1\times10^{-12}$ cc. cm/cm². sec. cmHg or less in terms of oxygen permeability of film. The oxygen permeability is a value measured according to the method described in ASTM D 1434–82 (1986).

The oxygen-shielding layer is peeled from the resist film after light exposure and then development is conducted. However, when the peeling is difficult (when the oxygen-shielding layer is a cover coating layer, the peeling is generally difficult), the peeling is not conducted and therefore the oxygen-shielding layer must be dissolved and removed during development.

As the film-formable resin capable of forming an oxygen-shielding layer which is soluble and removable during development and which satisfies the above-mentioned requirements for oxygen-shielding layer, there can be mentioned, for example, a polyvinyl alcohol, a partially saponified polyvinyl acetate, a mixture thereof, and a mixture of a polyvinyl alcohol and a polyvinyl acetate. These resins are preferred because they have excellent film formability and well soluble in an aqueous developer (e.g. water, dilute aqueous alkali solution or dilute aqueous acid solution). A solution (e.g. an aqueous solution) of the above film-formable resin is coated on a resist film and dried, whereby a cover coating layer can be formed. A preferable thickness of the cover coating layer is generally 0.5–5 μm, particularly 1–3 μm.

A cover film layer can be formed by attaching a free film of the above-mentioned film-formable resin to the surface of a resist film. When the cover film layer is peeled from the surface of the resist film after light exposure but before development, the cover film layer need not be soluble in the developer used and may be made of not only the above-mentioned film-formable resin but also of a polyester (e.g. a polyethylene terephthalate), an acrylic resin, a polyethylene, a polyvinyl chloride or the like. A preferable thickness of the cover film layer is generally 1–70 μm, particularly 2–40 μm.

The resist film formed from the present resist composition, which contains a radical-protecting compound, can considerably alleviate the inhibition of curing caused by oxygen even with no oxygen-shielding layer formed thereon and can maintain good photosensitivity. Formation of an oxygen-shielding layer, however, can further increase the sensitivity to visible laser.

Pattern-wise application of a visible laser to the resist film can be conducted, for example, by direct drawing using a visible laser, such as scanning of a visible laser based on the CAD data prepared beforehand. The source of the visible laser includes an Ar ion laser, an excimer laser, a carbon dioxide laser, etc. An appropriate exposure of the visible laser is generally 0.1–50 mJ/cm², preferably 0.3–30 mJ/cm², more preferably 0.5–10 mJ/cm².

The laser application cures the exposed portion of the resist film (negative type), and the unexposed portion is removed by development. After the laser application but before development, the resist film may be heated as necessary for stress relaxation of the resist film or for promotion of the post-reaction of the generated radical. This heating can be conducted in a short time by using a hot plate.

Development after the laser application can be conducted by washing the exposed resist film, for example, by immersing the resist film in a developer suitable for the kind of the resist film, such as acid developer, alkali developer, water, organic solvent or the like, or by spraying the above developer on the resist film. The conditions of development are not particularly restricted but are generally 15–40° C. for about 15 seconds to 5 minutes. After the development, water washing is conducted as necessary. The development step removes the unexposed portion of the resist film, whereby a resist pattern is formed. After the development step, the resist pattern may be as necessary heated or exposed to ultraviolet light for further curing. When exposure to ultraviolet light is employed for further curing, it is preferred to allow the resist composition to beforehand contain a photopolymerization initiator and a sensitizer both effective to ultraviolet light.

The resist pattern formed as above according to the present process can be used per se for decoration or other purposes, but may be used as an etching resist or as a solder resist.

The resist pattern can be used, for example, in formation of an electroconductive circuit pattern of printed circuit board. In this case, a resist pattern is formed according to the present process, on the electroconductive layer of a laminate plate comprising a substrate and, as the surface layer, an electroconductive layer made of copper or the like; using this resist pattern as an etching resist, the exposed portion of the electroconductive layer (the portion having no resist pattern thereon) is etched; thereby, a circuit pattern can be formed.

This etching can be conducted using an etchant selected so as to match, for example, the kind of the electroconductive layer. For example, when the electroconductive layer is copper, there can be used, as the etchant, an acidic etchant (e.g. cupric chloride), an ammonia type etchant or the like.

After the etching step, the remaining resist film is removed to obtain a printed circuit board. Removal of the remaining resist film is conducted by dissolving or peeling the resist film, and there can be used a solvent which is substantially inert to the substrate and the circuit pattern formed thereon (i.e. the remaining electroconductive layer). The solvent can be, for example, an aqueous alkali (e.g. sodium hydroxide) solution, an aqueous acid solution, or one of various organic solvents.

The present invention is hereinafter described specifically by the following Examples. In the followings, parts and % are by parts by weight and % by weight, respectively.

PRODUCTION EXAMPLE 1 (production of photocuring resin)

A mixture consisting of 40 parts of methyl methacrylate, 40 parts of butyl acrylate, 20 parts of acrylic acid and 2 parts of azobisisobutyronitrile was dropwise added, in 3 hours, to 90 parts of propylene glycol monomethyl ether kept at 110° C. in a nitrogen gas atmosphere. The resulting mixture was subjected to aging for 1 hour. Thereto was dropwise added, in 1 hour, a mixture consisting of 1 part of azobisdimethylvaleronitrile and 10 parts of propylene glycol monomethyl ether. The resulting mixture was subjected to aging for 5 hours to obtain a solution of a high-acid-value acrylic resin (resin acid value=155 mg KOH/g). To the solution were added 24 parts of glycidyl methacrylate, 0.12 part of hydroquinone and 0.6 part of tetraethylammonium bromide. The resulting mixture was subjected to a reaction at 110° C. for 5 hours while blowing air thereinto, to obtain a photocuring resin solution having a solid content of about 55.4%. The photocuring resin had a resin acid value of about 50 mg KOH/g, a polymerizable unsaturated group content of 1.35 moles/kg, a Tg of 20° C. and a number-average molecular weight of about 20,000.

PRODUCTION EXAMPLE 2 (production of photocuring resin)

A mixture consisting of 60 parts of styrene, 10 parts of methyl acrylate, 30 parts of acrylic acid and 3 parts of azobisisobutyronitrile was dropwise added, in 3 hours, to 90 parts of ethylene glycol monomethyl ether kept at 120° C. in a nitrogen gas atmosphere. The resulting mixture was subjected to aging for 1 hour. Thereto was dropwise added, in 1 hour, a mixture consisting of 1 part of azobisdimethylvaleronitrile and 10 parts of ethylene glycol monomethyl ether. The resulting mixture was subjected to aging for 5 hours to obtain a solution of a high-acid-value acrylic resin (resin acid value=233 mg KOH/g). To the solution were added 35 parts of glycidyl methacrylate, 0.13 part of hydroquinone and 0.6 part of tetraethylammonium bromide. The resulting mixture was subjected to a reaction at 110° C. for 5 hours while blowing air thereinto, to obtain a photocuring resin solution having a solid content of about 57.4%. The photocuring resin had a resin acid value of about 70 mg KOH/g, a polymerizable unsaturated group content of 1.83 moles/kg, a Tg of 45° C. and a number-average molecular weight of about 15,000.

PRODUCTION EXAMPLE 3 (production of photocuring resin)

A mixture consisting of 25 parts of methyl methacrylate, 15 parts of butyl acrylate, 15 parts of acrylic acid, 45 parts of 2-hydroxyethyl methacrylate and 2 parts of azobisisobutyronitrile was dropwise added, in 3 hours, to 100 parts of N,N-dimethylformamide kept at 80° C. in a nitrogen gas atmosphere. The resulting mixture was subjected to aging for 1 hour. Thereto was dropwise added, in 1 hour, a mixture consisting of 1 part of azobisdimethylvaleronitrile and 5 parts of N,N-dimethylformamide. The resulting mixture was subjected to aging for 5 hours to obtain a solution of a high-acid-value acrylic resin (resin acid value=115 mg KOH/g). To 200 parts of the solution was added 120 parts of pyridine. Then, 207 parts of a solution of 150 parts of N,N-dimethylformamide dissolved in 57 parts of cinnamic acid chloride was dropwise added at 10° C. or below. The resulting mixture was stirred at 50° C. for 4 hours to give rise to a reaction. The reaction mixture was poured into 500 parts of methanol to precipitate a polymer. The precipitate was purified and dried under vacuum to obtain a polymer. The polymer was a photocuring resin having cinnamoyl group as the photosensitive group and had a resin acid value of about 81 mg KOH/g, a cinnamoyl group content of 3.69 moles/kg, a Tg of 51° C. and a number-average molecular weight of about 20,000. 100 parts of this polymer was dissolved in a mixed solvent consisting of 50 parts of propylene glycol monomethyl ether and 50 parts of n-butanol, to obtain a photocuring resin solution.

EXAMPLE 1

181 parts (100 parts as solid content) of the photocuring resin solution obtained in Production Example 1 was dissolved in 290 parts of ethyl acetate. Thereto was added a solution of 1 part of LS-1 (a sensitizer) (see Note 1) dissolved in 5 parts of benzyl alcohol, followed by stirring. Thereto was added a solution of 1 part of T-1 (a polymerization initiator) (see Note 2) dissolved in 5 parts of benzyl alcohol, followed by stirring. Thereto was added a solution of 3 parts of N,N-dimethylaniline (a radical-protecting compound) dissolved in 10 parts of benzyl alcohol, followed by stirring, to obtain a uniform resist composition.

Note 1: LS-1 is a coumarin type sensitizer represented by the following formula:

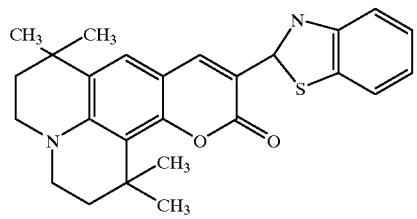

Note 2: T-1 is a titanocene type polymerization initiator represented by the following formula.

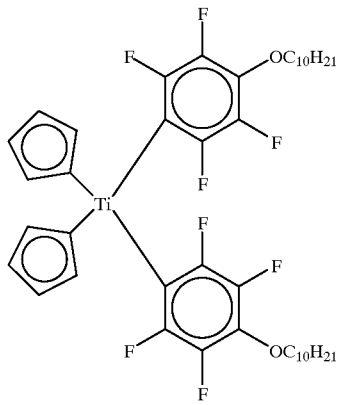

The above-obtained resist composition was coated, by the use of a bar coater, on a copper-clad glass fiber-reinforced epoxy substrate of 2 mm (thickness)×350 mm×460 mm having a 18 μm-thick copper layer on the surface. The coated composition was dried at 60° C. for 10 minutes to obtain a dried resist film having a thickness of 10 μm.

The above-obtained substrate having a resist film formed thereon was subjected to scanning exposure via a 21 step-wedge film using a visible laser (an Ar ion laser of 488 nm wavelength) so that the exposure became 3 mJ/cm$^2$. The resulting material was heated at 60° C. for 10 minutes and then immersed in a 1% aqueous sodium carbonate solution of 30° C., to conduct development to remove the uncured portion of the resist film. The sensitivity of the resist after development was Step No. 7 as measured using a 21 step-wedge film. Herein, the sensitivity of resist was determined as follows. A resist was subjected to light exposure via a film having a number of zones of gradually changing light permeabilities (a 21 step-wedge film was used in the present invention), and then to development; the Step No. of lowest light permeability which gave a good resist pattern, was taken as the sensitivity of the resist. Since a film zone of larger Step No. has lower light permeability, a larger Step No. of lowest light permeability giving a good resist pattern indicates higher sensitivity.

EXAMPLE 2

An operation was conducted in the same manner as in Example 1 except that on the resist film of the substrate having a resist film formed thereon, obtained in Example 1 was coated, by the use of a bar coater, an aqueous solution containing 12% of a polyvinyl alcohol (polymerization degree=1,700, Tg=65° C., oxygen permeability=2×10$^{-14}$ c. cm/cm$^2$. sec. cmHg) in an as-dried film thickness of 3 μm; then, drying was conducted at 60° C. for 10 minutes to form a cover coating layer on the resist film; the resulting material was subjected to light exposure. The sensitivity of the resist after development was Step No. 8.

EXAMPLE 3

An operation was conducted in the same manner as in Example 1 except that the material after light exposure was heated at 60° C. for 1 minute using a hot plate. The sensitivity of the resist after development was Step No. 7.

EXAMPLE 4

An operation was conducted in the same manner as in Example 1 except that there was used a resist composition obtained as follows. 122 parts (70 parts as solid content) of the photocuring resin solution obtained in Production Example 2 was dissolved in 290 parts of ethyl acetate. The resulting solution was mixed with 30 parts of trimethylolpropane triacrylate. The mixture was mixed with a solution of 1 part of LS-2 (a sensitizer) (see Note 3) dissolved in 5 parts of benzyl alcohol. The mixture was mixed with a solution of 7 parts of di-tert-butyl peroxyisophthalate (a polymerization initiator) dissolved in 10 parts of benzyl alcohol. The mixture was mixed with a solution of 3 parts of N,N,2,4,6-pentamethylaniline (a radical-protecting compound) dissolved in 10 parts of benzyl alcohol, to obtain a uniform resist composition. The sensitivity of the resist after development was Step No. 6.

Note 3: LS-2 is a coumarin type sensitizer represented by the following formula.

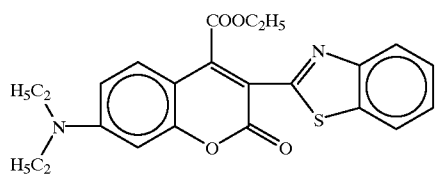

EXAMPLE 5

An operation was conducted in the same manner as in Example 1 except that the sensitizer LS-1 was changed to LS-3 (see Note 4). The sensitivity of the resist after development was Step No. 6.

Note 4: LS-3 is a coumarin type sensitizer represented by the following formula.

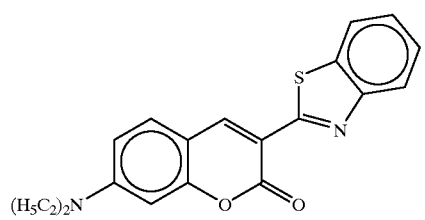

EXAMPLE 6

An operation was conducted in the same manner as in Example 1 except that 181 parts of the photocuring resin solution obtained in Production Example 1, used in Example 1 was changed to 200 parts (100 parts as solid content) of the photocuring resin solution obtained in Production Example 3. The sensitivity of the resist after development was Step No. 6.

COMPARATIVE EXAMPLE 1

An operation was conducted in the same manner as in Example 2 except that no N,N-dimethylaniline as radical-protecting compound was used. The sensitivity of the resist after development was Step No. 7.

EXAMPLES 7–15 AND COMPARATIVE EXAMPLE 2

Each operation was conducted in the same manner as in Example 4 except that the kind and amount of radical-protecting compound used in resist composition were as shown in Table 1 and that no radical-protecting compound was used in Comparative Example 2. The sensitivity (Step No.) of each resist after development is shown in Table 1.

TABLE 1

| | Radical-protecting compound | | Step No. of 21 |
| --- | --- | --- | --- |
| | Kind | Amount (parts) | step-wedge film |
| Example 7 | N,N-Dimethylaniline | 10 | 6 |
| Example 8 | N,N,2,4,6-Pentamethylaniline | 1 | 5 |
| Example 9 | N,N,2,4,6-Pentamethylaniline | 5 | 6 |
| Example 10 | N,N,2,4,6-Pentamethylaniline | 10 | 6 |
| Example 11 | N,N-Dimethyl-m-toluidine | 5 | 6 |
| Example 12 | 4-Bromo-N,N-dimethylaniline | 5 | 6 |
| Example 13 | 2,6-Diisopropyl-N,N-dimethyl-aniline | 5 | 6 |
| Example 14 | Triethyl phosphite | 5 | 5 |
| Example 15 | Triphenyl phosphite | 5 | 5 |
| Comparative Example 2 | Not used | — | 3 |

EXAMPLE 16

The resist composition used in Example 1 was coated, by the use of a blade coater, on a polyester film (to later become a cover film layer) having a thickness of 25 μm. The resulting material was dried at 100° C. for 4 minutes to form a visible light-curable photopolymerizable composition layer having a thickness of 50 μm. On this composition layer was laminated a polyethylene film having a thickness of 35 μm, as a protective film to obtain a dry film resist. The protective film was peeled, and the resist composition layer of the resulting material was heat-laminated on the same copper-clad glass fiber-reinforced epoxy substrate as used in Example 1, to obtain a substrate having thereon a resist film and a cover film in this order. The material was subjected to light exposure in the same manner as in Example 1; then, the cover film was peeled; the resulting substrate having a resist film thereon was dried at 60° C. for 10 minutes and then subjected to development in the same manner as in Example 1. The sensitivity of the resist after development was Step No. 6.

As stated above, the resist film formed from the resist composition of the present invention, when exposed to a visible laser, generates a radical; however, the radical is not deactivated by oxygen because the resist composition contains a particular radical-protecting compound, and accordingly, the resist film can be prevented from the hindrance of curing caused by the deactivation of radical by oxygen. Thus, a resist film of high sensitivity can be formed by the use of the present resist composition, and the resist film can be cured at high sensitivity even without forming a coating cover layer or a cover film layer thereon. The resist film can be cured at higher sensitivity by forming a coating cover layer or a cover film layer thereon.

In general, when hindrance of curing takes place in a resist film because of the presence of oxygen, the degree of curing of the resist film is insufficient at around its surface; as a result, the resist pattern formed has a semicylindrical sectional shape. However, with the present resist composition, since the hindrance of curing caused by the deactivation of radical by oxygen can be prevented, a resist pattern having a rectangular sectional shape can be formed.

We claim:

1. A photopolymerizable composition comprising:
    a photocuring acrylic resin having a (meth)acryloyl group as a photosensitive group, which is obtained by adding a glycidyl group-containing polymerizable unsaturated compound to an acrylic resin of high acid value;
    a photopolymerization initiator effective to promote curing of the resin upon exposure to a visible light, which is a combination of a compound represented by the following formula:

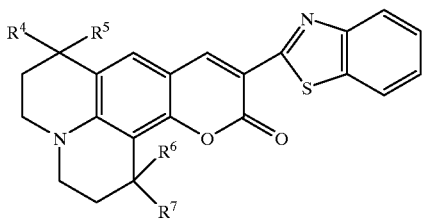

wherein $R^4$, $R^5$, $R^6$ and $R^7$ are each independently an alkyl group of 1–3 carbon atoms, with a titanocene compound; and
    at least one radical-protecting compound which is an aromatic compound having N,N-dimethylamino group bonded to the carbon atom forming the aromatic ring.

2. A photopolymerizable composition according to claim 1, wherein the aromatic compound having N,N-dimethylamino group bonded to the carbon atom forming the aromatic ring is an unsubstituted or substituted N,N-dimethylaniline.

3. A photopolymerizable composition according to claim 2, wherein the unsubstituted or substituted N,N-dimethylaniline is selected from the group consisting of N,N-dimethylaniline, 4-bromo-N,N-dimethylaniline, 4-tert-butyl-N,N-dimethylaniline, 2,6-diisopropyl-N,N-dimethylaniline, 4,4'-vinylidenebis(N,N-dimethylaniline), 4,4'-methylenebis(N,N-dimethylaniline), 4,4'-methylenebis(2,6-diisopropyl-N,N-dimethylaniline), N,N,2,4,6-pentamethylaniline, N,N-dimethyl-m-toluidine, 4-(2-pyridylazo)-N,N-dimethylaniline and N,N-dimethyl-4-nitrosoaniline.

4. A photopolymerizable composition according to claim 1, wherein the radical-protecting compound is an aromatic compound of 120–400 molecular weight having N,N-dimethylamino group bonded to the carbon atom forming the aromatic ring.

5. A photopolymerizable composition according to claim 1, containing the radical-protecting compound in an amount of 0.1–30 parts by weight per 100 parts by weight (as solid content) of the composition.

6. A photopolymerizable composition according to claim 1, further comprising an ethylenically unsaturated compound.

7. A photopolymerizable composition according to claim 6, comprising the photopolymerization initiator in an amount of 0.1–10 parts by weight per 100 parts by weight of the total of the photocuring resin and the ethylenically unsaturated compound.

8. A process for formation of a resist pattern, which comprises forming, on a substrate, a resist film made of a photopolymerizable composition of claim 1, then pattern-wise applying a visible laser to the resist film, and subjecting the visible laser-exposed resist film to development.

9. A process for formation of a resist pattern, which comprises forming, on a substrate, a resist film made of a photopolymerizable composition of claim 1, forming an oxygen-shielding layer on the resist film, then pattern-wise applying a visible laser to the resist film via the oxygen-shielding layer, and subjecting the visible laser-exposed resist film to development.

10. A resist film formed from a photopolymerizable composition of claim 1.

11. A photopolymerizable composition according to claim 1, wherein the photocuring acrylic resin having a (meth)acryloyl group has a molecular weight of 1,000–100,000 and the amount of (meth)acryloyl group of 0.2 to 5 moles/kg resin.

12. A photopolymerizable composition according to claim 1, wherein the acrylic resin of high acid value has an acid value of about 40–760.

* * * * *